(12) United States Patent
Bolli et al.

(10) Patent No.: US 6,376,150 B1
(45) Date of Patent: Apr. 23, 2002

(54) IR- AND UV-RADIATION-SENSITIVE COMPOSITION AND LITHOGRAPHIC PLATE

(75) Inventors: Angelo Bolli; Paolo Peveri, both of Manerbio; Andrea Tettamanti, Milan, all of (IT)

(73) Assignee: Lastra S.p.A., Manerbio (IT)

( * ) Notice: Subject to any disclaimer, the term of this patent is extended or adjusted under 35 U.S.C. 154(b) by 0 days.

(21) Appl. No.: 09/309,586

(22) Filed: May 11, 1999

(30) Foreign Application Priority Data

May 12, 1998 (IT) .......................... MI98A1023

(51) Int. Cl.$^7$ .......................... G03F 7/023; G03F 7/30
(52) U.S. Cl. .................. 430/165; 430/190; 430/191; 430/192; 430/193; 430/302
(58) Field of Search ................... 430/165, 190, 430/191, 192, 193, 302

(56) References Cited

U.S. PATENT DOCUMENTS

| | | | |
|---|---|---|---|
| 5,478,691 A | * 12/1995 | Miyashita et al. | 430/190 |
| 5,491,046 A | 2/1996 | DeBoer et al. | 430/302 |
| 5,641,608 A | 6/1997 | Grunwald et al. | 430/302 |
| 5,705,308 A | * 1/1998 | West et al. | 430/165 |
| 6,060,217 A | * 5/2000 | Nguyen et al. | 430/302 |

FOREIGN PATENT DOCUMENTS

| | | |
|---|---|---|
| DE | 44 26 820 A1 | 2/1995 |
| EP | 0 055 814 A2 | 7/1982 |
| EP | 0 672 954 | 9/1995 |
| EP | 0 737 895 A1 | 10/1996 |
| EP | 0 823 327 A2 | 2/1998 |
| EP | 0 833 204 | 4/1998 |
| WO | WO 96/20429 | 7/1996 |
| WO | 97/39894 | 10/1997 |
| WO | WO 99/01796 | 1/1999 |

* cited by examiner

*Primary Examiner*—John S. Chu
(74) *Attorney, Agent, or Firm*—Oblon, Spivak, McClelland, Maier & Neustadt, P.C.

(57) ABSTRACT

An IR- and UV-radiation-sensitive composition comprising a diazo resin, a diazo ester, at least one novolac resin and an IR-ray absorber. A lithographic plate comprising a support coated with the said photosensitive composition.

24 Claims, No Drawings

IR- AND UV-RADIATION-SENSITIVE COMPOSITION AND LITHOGRAPHIC PLATE

FIELD OF THE INVENTION

This application is based on application No. MI98A 0001023 filed in Italy, the content of which is incorporated hereinto by reference.

The present invention relates to an IR- and UV-radiation-sensitive Composition and to a lithographic plate.

In particular, the invention relates to an IR- and UV-radiation-sensitive composition which is useful for producing a positive-type lithographic plate.

BACKGROUND OF THE INVENTION

As is known, the technique of printing using a lithographic plate is based on the distinct partition fatty substances and water. The fatty substance or ink is preferably retained by the image area and the water is preferably retained by the non-image area. When the surface of a suitably prepared lithographic plate is moistened with water and then coated with ink, the non-image area retains the water and repels the ink, while the image area accepts the ink and repels the water. Then, the ink on the image area is transferred onto the surface of a material on which it is desired to reproduce the image, such as, for example, card, fabric and the like.

In general, the lithographic plates used in printing processes are formed of an aluminium support coated with a light-sensitive (photosensitive) composition. When this composition reacts to light of a suitable wavelength, such that the portion exposed to the light becomes soluble and thus able to be removed during the developing process, the printing process is referred to as a "positive" process. In contrast, when the portion exposed to the light becomes insoluble, the printing process is referred to as a "negative" process. In both cases, the remaining image area is lipophilic and thus accepts the ink, whereas the non-image area is hydrophilic and accepts the water.

Recent developments in the field of lithographic plates are oriented towards the search for compositions that are sensitive to laser light, preferably in the near-IR region, in particular to a laser light controlled by software, so as to transfer the image created by computer directly onto the surface of the plate. This technique has the advantage of dispensing with photographic films, with a consequent reduction in the pollution resulting from the chemical substances used to prepare and produce these films, and elimination of all the problems encountered in transferring the image onto the plate via photographic films.

Firstly, a composition which is sensitive to IR radiation emitted by a laser might make the system more reliable.

Secondly, it would be possible to work in ambient light, thus dispensing with the need for automatic loading systems and darkrooms.

Patent application WO 96/20429 describes a method for forming a lithographic printing matrix by means of the heat-printing method. This method includes the following stages: (i) coating a support, which can be used as a lithographic support, with a positive-type photosensitive composition comprising a naphthoquinonediazide ester of a phenolic resin or a naphthoquinonediazide ester and a phenolic resin and at least one substance capable of absorbing in the IR region, (ii) exposing the system to ultraviolet light (UV) so as to enable the photosensitive composition to be developed, (iii) imprinting on the plate with IR radiation emitted by a laser, and (iv) developing the plate in order to remove those areas of the photosensitive composition that have not been exposed to the laser.

In addition, in the course of the description, it is stated that the combination of the stages of exposure to light (UV) and of heating (by IR radiation) is essential for forming the image (page 7, lines 1–3).

Patent application WO 97/39894 describes a heat-sensitive olefinic composition comprising a polymer substance which is soluble in aqueous developer and a compound which reduces the solubility of the polymer substance in aqueous developer, characterized in that the solubility of the composition in aqueous developer is increased by heating but is not increased by the incident UV radiation (see Claim 1). In other words, the said plate is sensitive to IR but not to UV.

Preferably, the heat-sensitive composition comprises no UV-sensitive components (page 17, lines 17–18).

EP-A-0 833 204 discloses an infrared radiation sensitive imaging composition contains two essential component, namely an infrared radiation absorbing material, and a phenolic resin that is either mixed or reacted with an o-diazonaphthoquinone derivative. These compositions are useful in imaging elements such as lithographic printing plates that can be used to provide either positive or negative images using laser imaging, and that can be adapted to direct-to-plate imaging procedures. However, none of the examples of EP-A-0 833 204 relates to the use of said composition in a process for obtaining an image after UV exposure only.

Photosensitive plates which, like those of the abovementioned patent applications WO 96/20429 and WO 97/39894, necessarily require exposure to IR light, are currently seldom used since plants capable of printing on a lithographic plate with laser light are still very expensive. Thus, a period of transition is currently being experienced during which many operators are still using the old technique of printing on the plate by exposure to UV lamps by means of a master image, while a few—those who already have the necessary equipment—require plates that are sensitive to IR light.

Patent application EP 0 672 954 attempts to address this requirement, disclosing a photosensitive coating for a lithographic plate which is sensitive to both UV and IR radiation and is capable of functioning in both positive and negative modes. The said coating includes a resol resin, a novolac resin, an s-triazine substituted with a haloalkyl group and an IR absorber. The solubility of the abovementioned composition in a solution of alkaline aqueous developer is reduced in the exposed area and increased in the unexposed area during the stages of (i) exposure to the radiation which forms the image, and (ii) heating. In the course of the description, it is specified that in order to be able to use the plate in negative mode, it is essential that both resol and novolac resins are present (page 4, lines 10–13).

The inventors of the present invention have used a plate according to patent application EP 0 672 954 to form UV-positive images and have found that the image thus obtained shows little resistance either to the alkaline developer solution or to the isopropyl alcohol in the bathing solution used during the printing, and in addition the said image also shows little resistance to mechanical abrasion.

OBJECTS OF THE INVENTION

A first object of the present invention is to provide a composition which is sensitive to both IR and UV radiation.

A second object of the present invention is that the said composition should give good results during alkaline developing, irrespective of the system (UV or IR) used to imprint it.

A third object of the present invention is that the said composition should give an image which, after developing, has good resistance to the solvents used in printing processes and, in particular, to isopropyl alcohol.

A fourth object of the present invention is to provide a lithographic plate comprising a composition having the abovementioned characteristics.

DEFINITIONS

The term "lithographic plate" is understood to refer to a support coated with a photosensitive coating which, after having been appropriately exposed and developed, is used as a planographic matrix in printing processes in which there is a distinct partition fatty substances and water.

Typical examples of support materials are aluminium, zinc and copper, polymeric supports such as polyester, and paper coated with a polymer.

Even more typically, the support is a metal sheet, made of electrograined aluminium, which has been oxidized and suitably treated to receive the photosensitive composition.

The term "positive type" is understood to mean that that portion of photosensitive coating exposed to the radiation becomes soluble so that it can be removed during the process for developing the plate. Typically, the developing process is carried out in alkali with a conductivity of 75 and 110 mS.

The term "diazo resin" is understood to refer to the product of esterification of a 2,1-naphthoquinonediazide-4-sulphonyl chloride with a product of polycondensation of phenol or homologues thereof such as, for example, m-cresol or symmetric xylenol. Typical examples of such commercial diazo resins are the products RO 874 and RO 849 from the company Rohner (Pratteln, Basle, Switzerland) and A 938 from the company Materiali Sensibili (Milan, Italy).

Alternatively, the term "diazo resin" is understood to refer to the product of esterification of a 2,1-naphthoquinonediazide-5-sulphonyl chloride with a product of polycondensation of phenol or homologues thereof such as, for example, m-cresol and symmetric xylenol. Typical examples of such commercial diazo resins are the products PW 1160 and PW 1161 from the company Clariant (Wiesbaden, Germany) and DRS 25 from the company Materiali Sensibili.

In general, the diazo resin has a weight-average molecular weight of 5000 and 12,000.

The term "novolac" is understood to refer to a polymer obtained, in acid medium, by reaction formaldehyde and phenol and/or m-cresol and/or symmetric xylenol in a molar ratio of less than 1 (for example, formaldehyde: phenol= 1:2).

Typical examples of commercial novolac resins are high weight-average molecular weight novolac resin such as LB 6564 (weight-average molecular weight=6000–10,000) and LB 744 (weight-average molecular weight=8000–13,000) from the company Bakelite (Germany), R 7100 (weight-average molecular weight=8000–10,000) from the company Rohner, and PN 430 (weight-average molecular weight= 5000–9500) from the company Clariant and low weight-average molecular weight novolac resin such as PN 320 (weight-average molecular weight=3000–5000). A preferred form of R 7100 is obtained by removing monomers from LB 744, thus resulting in a substantially monomers-free resin having a weight-average molecular weight of from 9,500 to 10,500.

The term "diazo ester" is understood to refer to the product of total or partial esterification of a 2,1-naphthoquinonediazidesulphonyl chloride with a tetrahydroxybenzophenone.

Typical examples of diazo esters are those obtained by total or partial esterification of a 2,3,4,4'-tetrahydroxybenzophenone or a 2,2',4,4'-tetrahydroxybenzophenone with 2,1-naphthoquinonediazide-4-sulphonyl chloride or those obtained by total or partial esterification of a 2,3,4,4'-tetrahydroxybenzophenone or of a 2,2',4,4'-tetrahydroxybenzophenone with 2,1-naphthoquinonediazide-5-sulphonyl chloride.

A typical example of a diazo ester is the product obtained by total or partial esterification of 2,2',4,4'-tetrahydroxybenzophenone with 2,1-naphthoquinonediazide-4-sulphonyl chloride giving a mixture of mono-, di-, tri- and tetra ester of 2,2',4,4'-tetrahydroxybenzophenone, which is sold under the name SDBZ by the company Materiali Sensibili. Typically, SDBZ contains from 5 to 20% of monoester, from 40 to 60% of diester, from 20 to 40% of triester and from 1 to 10% of tetraester of 2,2',4,4'-tetrahydroxybenzophenone.

The term "absorber" is understood to refer to a substance capable of absorbing radiation of a certain wavelength. Preferably, the absorber is soluble in water, ketones and/or glycols, alcohols and/or mixtures thereof.

Typical examples of absorbers are the commercial products KF 646, KF 645, KF 810, KF 1003, KF 1002, IR HBB 812 and KF 818 from the company Riedel-de-Haen/Allied Signal (Seelze, Germany), the commercial products ADS 805PI, ADS805PP, ADS805PA, ADS805PF, ADS812MI, ADS812MI, ADS815EI, ADS818HI, ADS818HT, ADS822MT, ADS830AT, ADS 830A and ADS838MT from the company American Dye Source (Varennes, Quebec, Canada), the product Projet 830 NP and the product Cyanine Infrared Absorbing Dye sold by the company Zeneca Specialties (Manchester, England). For convenience, Cyanine Infrared Absorbing Dye will be referred to hereinbelow by the abbreviation "Z".

A particularly advantageous family of absorbers is that characterized by the following skeleton:

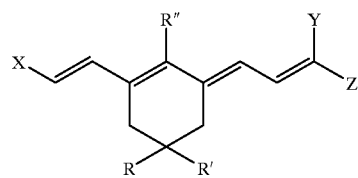

in which X, Y, Z, R, R' and R" can have many meanings. Typical examples of these meanings are: simple or fused heterocyclic ring for X, simple or fused heterocyclic ring for Z and Y together with the carbon atom to which they are attached, hydrogen, $C_{1-3}$ alkyl, $SO_3^-$ or $COO^-$ for R and R' independently of each other, and H or Cl for R". Specific examples of the said heterocyclic rings are:

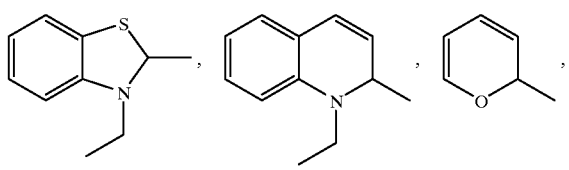

The presumed structures of certain specific absorbers are:
KF 646

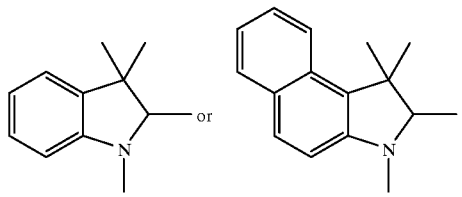

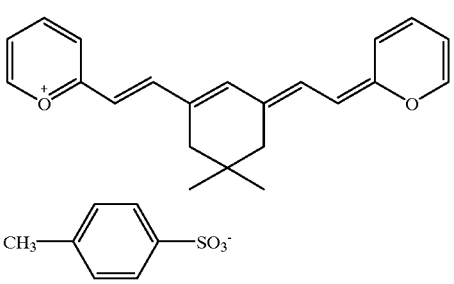

The term "IR radiation" is understood to refer to radiation with a wavelength greater than 780 nm.

A typical example of a device used to generate IR radiation is a laser diode which emits at about 830 nm.

The term "UV radiation" is understood to refer to radiation with a wavelength of about 10 and about 400 nm.

A typical example of a device used to emit UV radiation is a carbon arc lamp, a mercury vapour lamp, a fluorescent lamp, a tungsten filament lamp, a photographic lamp and a 5000 W actinic-light lamp, which emit in the region 350 and 400 nm.

The term "dye" is understood to refer to a coloured compound or preparation capable of tinting the photosensitive composition in order to reveal the image after exposure to light and/or after developing.

Typical examples of dyes are Basonyl blue 636 (Colour Index 42595) from the company BASF (Germany) and Sudan Yellow 150 (Colour Index 11021) from the company BASF (Germany) or mixtures thereof.

The term "triazine" is understood to refer to the family to which the following compounds belong: 2-(1-naphthyl)-4, 6-bis(trichloromethyl)-s-triazine, 2-(4-methoxy-1-naphthyl)-4,6-bis(trichloromethyl)-s-triazine, 2-(4-ethoxy-1-naphthyl)-4,6-bis(trichloromethyl)-s-triazine, 2-(4-butoxy-1-naphthyl)-4,6-bis(trichloromethyl)-s-triazine, 2-[4-(2-methoxyethyl)-1-naphthyl]-4,6-bis(trichloromethyl)-s-triazine, 2-[4-(2-ethoxyethyl)-1-naphthyl]-4,6-bis(trichloromethyl)-s-triazine, 2-[4-(2-butoxyethyl)-1-naphthyl]-4,6-bis(trichloromethyl)-s-triazine, 2-(2-methoxy-naphthyl)-4,6-bis(trichloromethyl)-s-triazine, 2-(6-methoxy-5-methyl-2-naphthyl)-4,6-bis(trichloromethyl)-s-triazine, 2-(6-methoxy-2-naphthyl)-4,6-bis(trichloromethyl)-s-triazine, 2-(5-methoxy-1-naphthyl)-4,6-bis(trichloromethyl)-s-triazine, 2-(4,7-dimethoxy-1-naphthyl)-4,6-bis(trichloromethyl)-s-triazine, 2-(6-methoxy-2-naphthyl)-4,6-bis-(trichloromethyl)-s-triazine, 2-(4,5-dimethoxy-1-naphthyl)-4,6-bis(trichloromethyl)-s-triazine, 2-(5-acenaphthyl)-4,6-bis(trichloromethyl)-s-triazine, 2-(2-naphthyl)-4,6-bis (trichloromethyl)-s-triazine, 2-(9-phenanthryl)-4,6-bis(trichloromethyl)-s-triazine, 2-(2-dibenzothienyl)-4,6-bis(trichloromethyl)-s-triazine, 2-(3-benzopyranyl)-4,6-bis(trichloromethyl)-s-triazine, 2-(4-alkoxy-1-anthracyl)-4,6-bis(trichloromethyl)-s-triazine, 2-methyl-4,6-bis(trichloromethyl)-s-triazine, 2-(4-methoxy-styryl)-4,6-bis(trichloromethyl)-s-triazine, 2-(2,3methylenedioxybenzyl)-4,6-bis(trichloromethyl)-s-triazine and (4-methoxy-phenyl)-4,6-bis(trichloromethyl)-s-triazine.

SUMMARY OF THE INVENTION

A composition has now been found which gives (i) good results during alkaline developing, irrespective of the system (UV or IR) used to imprint it, (ii) an image which, after developing, has good resistance to the solvents used in printing processes, in particular to isopropyl alcohol, and a lithographic plate comprising the said composition having the abovementioned characteristics.

A first subject of the present invention is therefore a photosensitive composition, characterized in that it comprises
(a) a diazo resin,
(b) a diazo ester,
(c) at least one novolac resin,
(d) an IR ray absorber, and is sensitive to both IR radiation and UV radiation.

A second subject of the present invention is a lithographic plate comprising a support coated with a photosensitive composition, characterized in that
(1) the said composition comprises
(a) a diazo resin,
(b) a diazo ester,
(c) at least one novolac resin,
(d) an IR ray absorber, and in that
(2) the said composition is sensitive to both IR radiation and UV radiation.

Typically, the IR radiation has a wavelength greater than 780 nm, and even more typically it has a wavelength of about 830 nm.

Typically, the UV radiation has a wavelength of about 10 and about 400 nm, and even more typically has a wavelength of 350 and 400 nm.

Preferably, the diazo resin is the product of esterification of a 2,1-naphthoquinonediazidesulphonyl chloride with a product of polycondensation of phenol and/or homologues thereof.

Typically, the diazo resin is the product of esterification of:

2,1-naphthoquinonediazide-4-sulphonyl chloride with a product of polycondensation of phenol or homologues thereof such as, for example, m-cresol and symmetric xylenol. Preferred examples of such commercial diazo resins are chosen from the group comprising the products RO 874 (nitrogen content=1.6% by weight) and RO 849 (nitrogen content=1.9% by weight) from the company Rohner and A 938 (nitrogen content=2.8% by weight) from the company Materiali Sensibili, and/or 2,1-naphthoquinonediazide-5-sulphonyl chloride with a product of polycondensation of phenol or homologues thereof such as, for example, m-cresol and symmetric xylenol. Preferred examples of such commercial diazo resins are chosen from the group comprising the products PW 1160 (nitrogen content=2.4% by weight) and PW 1161 (nitrogen content=3.2% by weight) from the company Clariant and DRS 25 (nitrogen content=2.4% by weight) from the company Materiali Sensibili.

Typically, the diazo resin of the present invention has a weight-average molecular weight of from 3000 to 15,000, preferably of from 5000 to 12,000.

Generally, the composition of the invention may also contain a mixture of diazo resins.

Preferably, the nitrogen content of said diazo resin is of from 1 to 8% by weight. More preferably, said content is of from 1.2 to 3.2% by weight.

Preferably, the diazo ester is a product of partial or total esterification of a tetrahydroxybenzophenone with a 2,1-naphthoquinonediazide sulphonyl chloride.

Typical examples of diazo esters are those obtained by total or partial esterification of a 2,3,4,4'-tetrahydroxybenzophenone or of a 2,2',4,4'-tetrahydroxybenzophenone with 2,1-naphthoquinonediazide-4-sulphonyl chloride or those obtained by total or partial esterification of a 2,3,4,4'-tetrahydroxybenzophenone or of a 2,2',4,4'-tetrahydroxybenzophenone with 2,1-naphthoquinone diazide-5-sulphonyl chloride.

Even more typically, the diazo ester is the product obtained by total or partial esterification of 2,2',4,4'-tetrahydroxybenzophenone with 2,1naphthoquinonediazide-4-sulphonyl chloride giving a mixture of mono-, di-, tri- and tetraester of 2,2',4,4'-tetrahydroxybenzophenone, sold under the name SDBZ by the company Materiali Sensibili.

Typically, SDBZ contains from 5 to 20% of monoester, from 40 to 60% of diester, from 20 to 40% of triester and from 1 to 10% of tetraester of 2,2',4,4'-tetrahydroxybenzophenone.

Typically, the nitrogen content of the diazo ester is of from 5 to 13% by weight. Preferably, said content is of from 6 to 9% by weight.

Preferably, the composition of the present invention comprises two novolac resins in which the first novolac resin has a weight-average molecular weight of from 2000 to 6000, while the second has a weight-average molecular weight of from 7000 to 14,000. Even more preferably, the first has a weight-average molecular weight of from 3000 to 5000 and the second has a weight-average molecular weight of from 8000 to 10,000.

Typical examples of suitable commercial novolacs are the high weight-average molecular weight novolac resins such as LB 6564 (weight-average molecular weight=6000–10,000) and LB 744 (weight-average molecular weight= 8000–13,000) from the company Bakelite, R 7100 (weight-average molecular weight=9500–10,500) from the company Rohner, and PN 430 (weight-average molecular weight= 5000–9500) from the company Clariant and the low weight-average molecular weight novolac resin PN 320 (weight-average molecular weight=3000–5000).

Preferably, the novolac resin according to the present invention is a mixture of at least one high weight-average molecular weight and at least one low weight-average molecular novolac resin. More preferably, the high weight-average molecular weight novolac resin is of about 30–40% by weight in the entire photosensitive composition.

Typically, the novolac resin of the present invention have a softening temperature of from 75 to 135° C. Even more typically, the softening temperature of the low weight-average molecular weight novolac resin is of from 75 to 90° C. and the softening temperature of the high weight-average molecular weight novolac resin is of from 125 to 140° C.

Preferred examples of absorbers are the compounds chosen from the group comprising the commercial products KF 646, KF 645, KF 810, KF 1003, KF 1002, IR HBB 812 and KF 818 from the company Riedel-de-Haen/Allied Signal, the commercial products ADS 805PI, ADS805PP, ADS805PA, ADS805PF, ADS812MI, ADS812MI, ADS815EI, ADS818HI, ADS818HT, ADS822MT, ADS830AT, ADS 830A and ADS838MT from the company American Dye Source, the commercial product Projet 830 NP and the commercial product Cyanine Infrared Absorbing dye from the company Zeneca Specialties.

Preferably, the lithographic plate of the present invention is of positive type.

The composition of the present invention can also comprise a dye.

Preferred examples of dyes are Basonyl Blue 636 (Colour Index 42595) from the company BASF and Sudan Yellow 150 (Colour Index 11021) from the company BASF, and mixtures thereof.

Preferably, the composition of the present invention can also comprise a triazine. Even more preferably, it comprises a triazine substituted with 2 haloalkyl groups.

Typical examples of triazines are 2-(1-naphthyl)-4,6-bis(trichloromethyl)-s-triazine, 2-(4-methoxy-1-naphthyl)-4,6-bis(trichloromethyl)-s-triazine, 2-(4-ethoxy-1-naphthyl)-4,6-bis(trichloromethyl)-s-triazine, 2-(4-butoxy-1-naphthyl)-4,6-bis(trichloromethyl)-s-triazine, 2-[4-(2-methoxyethyl)-1-naphthyl]-4,6-bis(trichloromethyl)-s-triazine, 2-[4-(2-ethoxyethyl)-1-naphthyl]-4,6-bis(trichloromethyl)-s-triazine, 2-[4-(2-butoxyethyl)-1-naphthyl]-4,6-bis(trichloromethyl)-s-triazine, 2-(2-methoxy-1-naphthyl)-4,6-bis(trichloromethyl)-s-triazine, 2-(6-methoxy-5-methyl-2-naphthyl)-4,6-bis(trichloromethyl)-s-triazine, 2-(6-methoxy-2-naphthyl)-4,6-bis(trichloromethyl)-s-triazine, 2-(5-methoxy-1-naphthyl)-4,6-bis(trichloromethyl)-s-triazine, 2-(4,7-dimethoxy-1-naphthyl)-4,6-bis(trichloromethyl)-s-triazine, 2-(6-methoxy-2-naphthyl)-4,6-bis(trichloromethyl)-s-triazine, 2-(4,5-dimethoxy-1-naphthyl)-4,6-bis(trichloromethyl)-s-triazine, 2-(5-acenaphthyl)-4,6-bis(trichloromethyl)-s-triazine, 2-(2-naphthyl)-4,6-bis(trichloromethyl)-s-triazine, 2-(9-phenanthryl)-4,6-bis(trichloromethyl)-s-triazine, 2-(2-dibenzothienyl)-4,6-bis(trichloromethyl)-s-triazine, 2-(3-benzopyranyl)-4,6-bis(trichloromethyl)-s-triazine, 2-(4-alkoxy-1-anthracyl)-4,6-bis(trichloro-methyl)-s-triazine, 2-methyl-4,6-bis(trichloromethyl)-s-triazine, 2-(4-methoxystyryl)-4,6-bis(trichloromethyl)-s-triazine, 2-(2,3-methylenedioxybenzyl)-4,6-bis(trichloromethyl)-s-triazine and 2-(4-methoxyphenyl)-4,6-bis(trichloromethyl)-s-triazine.

Even more preferably, the triazine is 2-(4-methoxy-1-naphthyl)-4,6-bis(trichloromethyl)-s-triazine sold by the company Clariant under the reference code BU 1557.

The present invention is described in further detail in the following examples and tests which are given for illustrative purposes only and should not be considered as limiting the invention.

Experimental Section

EXAMPLE 1

Preparation of the photosensitive composition 1

| Components | % (w/w) |
|---|---|
| A 938 | 35.37 |
| SDBZ | 2.04 |
| PN 320 | 20.27 |
| R 7100 | 36.49 |
| "Z" | 5.83 |

A composition was prepared by dissolving 1.75 g of diazo resin A 938 (weight-average molecular weight of about 7400; nitrogen content=2.8% by weight), 0.1 g of diazo ester SDBZ (nitrogen content=8% by weight), 1.0 g of novolac resin PN 320 (weight-average molecular weight of about 3700), 1.8 g of novolac resin R 7100 (weight-average molecular weight of about 9600) and 0.29 g of absorber "Z" in 120 g (148.5 ml) of a solution (w/w) of acetone:methanol:methyl glycol=9.5:1:1.5, under magnetic stirring at room temperature (20–25° C.) until no material remained at the bottom of the vessel (about 1 hour). The solution obtained was finally filtered through filter paper of the type 0860 from the company Schleicher & Schuell (100 μm).

The thus prepared composition has a nitrogen content of from 1.1 to 1.2% by weight, calculated on the dry composition.

EXAMPLE 2

Preparation of the Photosensitive Composition 2

The process was performed in a manner similar to that described in the above Example 1, except that the composition also comprised the (dye Basonyl Blue 636 (0.0725 g).

| Components | % (w/w) |
|---|---|
| A 938 | 34.81 |
| SDBZ | 2.00 |
| PN 320 | 20.00 |
| R 7100 | 35.99 |
| "Z" | 5.75 |
| Basonyl Blue 636 | 1.45 |

The thus prepared composition has a nitrogen content of from 1.1 to 1.2% by weight, calculated on the dry composition.

EXAMPLE 3

Preparation of the Photosensitive Composition 3

The process was performed in a manner similar to that described in Example 1 above, except that the composition also comprised a mixture of the dye Basonyl Blue 636 (0.0625 g) and of the dye Sudan Yellow 150 (0.01 g).

| Components | % (w/w) |
|---|---|
| A 938 | 34.81 |
| SDBZ | 2.00 |
| PN 320 | 20.00 |
| R 7100 | 35.99 |
| "Z" | 5.75 |
| Basonyl Blue 636 | 1.25 |
| Sudan Yellow 150 | 0.2 |

The thus prepared composition has a nitrogen content of from 1.1 to 1.2% by weight, calculated on the dry composition.

EXAMPLE 4

Preparation of the Photosensitive Composition 4

The following composition was prepared in a pilot plant.

| Components | % (w/w) |
|---|---|
| A 938 | 34.81 |
| SDBZ | 2.00 |
| PN 320 | 20.00 |
| R 7100 | 35.99 |
| "Z" | 5.75 |
| Basonyl Blue 636 | 1.15 |
| Sudan Yellow 150 | 0.3 |

2.512 kg of diazo resin A 938, 144 g of diazo ester SDBZ (nitrogen content=8% by weight), 1.44 kg of novolac resin PN 320, 2.591 kg of novolac resin R 7100, 414 g of absorber "Z", 82 g of dye Basonyl Blue 636 and 22 g of dye Sudan Yellow 150 were dissolved in 60 liters of a mixture (w/w) of acetone:methanol:methyl glycol=9.5:1:1.5, under magnetic stirring at room temperature (20–25° C.), until no material remained at the bottom of the vessel. The solution obtained was finally filtered through filter paper of the type 0860 from the company Schleicher & Schuell (100 μm).

The thus prepared composition has a nitrogen content of from 1.1 to 1.2% by weight, calculated on the dry composition.

EXAMPLE 5

Preparation of the Photosensitive Composition 5

| Compound | % (w/w) |
| --- | --- |
| PW 1160 | 14.21 |
| SDBZ | 2.00 |
| PN 320 | 27.07 |
| R 7100 | 32.07 |
| KF 646 | 11.50 |
| Basonyl Blue 636 | 1.45 |
| BU 1557 | 11.70 |

0.497 g of diazo resin PW 1160 (weight-average molecular weight of about 9300; nitrogen content=2.4% by weight), 0.07 g of diazo ester SDBZ (nitrogen content=8% by weight), 0.947 g of novolac resin PN 320, 1.123 g of novolac resin R 7100, 0.4 g of absorber KF 646, 0.051 g of dye Basonyl Blue 636 and 0.412 g of triazine BU 1557 were dissolved in 21.5 g (22.4 ml) of methyl glycol under magnetic stirring at room temperature (20–25° C.), until no material remained at the bottom of the vessel. The solution obtained was finally filtered through filter paper of the type 0860 from the company Schleicher & Schuell (100 μm).

The thus prepared composition has a nitrogen content of from 0.45 to 0.6% by weight, calculated on the dry composition.

EXAMPLE 6

Preparation of the Photosensitive Composition 6

The process was performed in a manner similar to that described in Example 5 above, except that the diazo resin was A 938 (0.497 g) instead of PW 1160.

| Compound | % (w/w) |
| --- | --- |
| A 938 | 14.21 |
| SDBZ | 2.00 |
| PN 320 | 27.07 |
| R 7100 | 32.07 |
| KF 646 | 11.50 |
| Basonyl Blue 636 | 1.45 |
| BU 1557 | 11.70 |

The thus prepared composition has a nitrogen content of from 0.45 to 0.60% by weight, calculated on the dry composition.

EXAMPLE 7

Preparation of the Photosensitive Composition 7

The following composition was prepared in a pilot plant.

| Compound | % (w/w) |
| --- | --- |
| PW 1160 | 34.81 |
| SDBZ | 2.00 |
| PN 320 | 20.00 |
| R 7100 | 35.99 |
| "Z" | 5.75 |
| Basonyl Blue 636 | 1.15 |
| Sudan Yellow 150 | 0.3 |

2.512 Kg of diazo resin PW 1160, 144 g of diazo ester SDBZ, 1.44 Kg of novolac resin PN 320, 1.123 g of novolac resin R 7100, 414 g of absorber "Z", 82 g of dye Basonyl Blue 636 and 22 g of dye Sudan Yellow 150 were dissolved in 60 liters of a mixture of acetone: methyl glycol (ratio (w/w)=9.5:1.5) under magnetic stirring at room temperature (20–25° C.), until no material remained at the bottom of the vessel. The thus obtained solution was then filtered through a paper filter (0860 type from company Schleicher & Schuell, 100 μm).

The thus prepared composition had a nitrogen content of from 1.1 to 1.2% by weight, calculated on the dry composition.

EXAMPLE 8

Preparation of the Photosensitive Composition 8

The following composition was prepared in a pilot plant.

| Compound | % (w/w) |
| --- | --- |
| A 938 | 74.00 |
| SDBZ | 2.00 |
| PN 320 | 17.00 |
| "Z" | 5.75 |
| Basonyl Blue 636 | 1.15 |

5.328 Kg of diazo resin A 938, 144 g of diazo ester SDBZ, 1.224 Kg of novolac resin PN 320, 414 g of absorber "Z", 83 g of dye Basonyl Blue 636 were dissolved in 60 liters of a mixture of acetone:methanol:methyl glycol (ratio (w/w)= 9.5:1:1.5) under magnetic stirring at room temperature (20–25° C.), until no material remained at the bottom of the vessel. The thus obtained solution was then filtered through a paper filter (0860 type from company Schleicher & Schuell, 100 μm).

The thus prepared composition had a nitrogen content of from 2.2 to 2.4% by weight, calculated on the dry composition.

EXAMPLE 9

Exposure to IR

The composition of Example 1 was spread on electrograined and anodised aluminium plates. The plates thus coated were dried in a forced circulation oven such as a Pid System M80-VF from the company Instrument S.R.L. (Bernareggio, Milan, Italy) at 90° C. for 8 minutes. The weight of the dry photosensitive coating was 1.2–1.4 g/m².

The Ugra/Fogra PostScript Control Strip digital scale was projected onto a plate thus obtained by means of a software-controlled laser beam ($\lambda$=830 nm; power of 150 and 300 mJ/cm$^2$) and was then developed at 22.4° C. and at a speed of 20 cm/minute using an alkaline metasilicate solution with a conductivity of 100 mS.

The plate thus obtained correctly had all the percentages of half-tones of the abovementioned Ugra/Fogra PostScript Control Strip digital scale.

Similar results were obtained with plates prepared using the compositions described in Examples 24 above.

The plates obtained from the compositions of Examples 5 and 6, were exposed as described hereinabove, and developed with an alkaline metasilicate solution having a conductivity of about 100 mS at 20° C., at a speed of 65 cm/minute. The plates thus obtained had deviations of about 5% (loss of the point) from the percentages of half-tones in the Ugra/Fogra PostScript Control Strip digital scale.

The plates obtained from the compositions of the above Examples 7 and 8, were exposed as described hereinabove, and developed with an alkaline metasilicate solution, having a conductivity of about 100 mS at 20° C., at a speed of 20 cm/minute. The thus obtained plates showed deviations of about 10% (enlargement of the point) from the percentages of half-tones in the Ugra/Fogra PostScript Control Strip digital scale. These plates did not completely develop and showed emulsion residues in the exposed areas.

EXAMPLE 10

Exposure to UV

Tests of sensitivity to UV light were carried out on plates prepared according to Example 7 above, using the composition of Example 1. The weight of the dry photosensitive coating was 1.4 g/m$^2$ (Plate A) and 1.8 g/m$^2$ (Plate B).

The abovementioned Plates A and B and the Kodak plates sold under the name Direct Image Thermal Printing Plate (Plate C), which were assumed to have been produced according to patent application EP 0 672 954, were exposed to UV light by projecting a conventional Ugra scale onto them. Four different exposure times (30, 40, 50 and 60 seconds) were used. The apparatus was a Lastra model EM 87 printing down frame, with a 5000 W actinic-light lamp placed 1.20 m from the support plane of the plate.

The abovementioned plates were then subjected to two developing tests:

Test 1

An alkaline metasilicate solution at 20° C. (Lsp 75 positive developing solution from the company Lastra S.p.A. with a conductivity of about 80 mS) was used. The developing lasted for 50 seconds. The plates were then wiped with a pad of cotton wool for 10 seconds, in order to remove the soluble part of the coating, and dried.

The results obtained were evaluated according to the conventional technique of the Ugra scale (Tables 1–5).

Test 2

This test was carried out as for Test 1 above, except that the immersion time in the developing solution was 10 seconds instead of 50 seconds.

The results obtained were evaluated according to the conventional technique of the Ugra scale (Tables 6–10).

TABLE 1

Scale of greys at different UV exposure times

| Plates | 30 seconds | 40 seconds | 50 seconds | 60 seconds |
|---|---|---|---|---|
| A | 4 veiled<br>8 full | 5 veiled<br>9 full | 5/6 veiled<br>9 full | 6 veiled<br>10 full |
| B | 3 veiled<br>8 full | 4 veiled<br>9 full | 5 veiled<br>10 full | 5/6 veiled<br>10 full |
| C | image completely wiped off | image completely wiped off | image completely wiped off | image completely wiped off |

TABLE 2

Positive microlines at different UV exposure times

| Plates | 30 seconds | 40 seconds | 50 seconds | 60 seconds |
|---|---|---|---|---|
| A | 8 clearly visible | 8 clearly visible | 10 clearly visible | 12 clearly visible |
| B | 6 clearly visible | 10 clearly visible | 12 clearly visible | 12/15 clearly visible |
| C | image completely wiped off | image completely wiped off | image completely wiped off | image completely wiped off |

TABLE 3

Reproduction of the minima at different UV exposure times

| Plates | 30 seconds | 40 seconds | 50 seconds | 60 seconds |
|---|---|---|---|---|
| A | 2% clearly visible<br>1% partially visible | 2% clearly visible | 3% clearly visible<br>2% visible | 3% clearly visible<br>2% visible |
| B | 2% clearly visible<br>1% partially visible | 2% clearly visible | 3% clearly visible<br>2% visible | 3% clearly visible<br>2% visible |
| C | image completely wiped off | image completely wiped off | image completely wiped off | image completely wiped off |

TABLE 4

Reproduction of the maxima at different UV exposure times

| Plates | 30 seconds | 40 seconds | 50 seconds | 60 seconds |
|---|---|---|---|---|
| A | 99% open | 99% open | 99% open | 99% open |
| B | 99% open | 99% open | 99% open | 99% open |
| C | image completely wiped off | image completely wiped off | image completely wiped off | image completely wiped off |

TABLE 5

Reading* of the screen corresponding to 40% of the Ugra scale at different UV exposure times

| Plates | 30 seconds | 40 seconds | 50 seconds | 60 seconds |
|---|---|---|---|---|
| A | 40% | 39% | 38.5% | 38% |
| B | 40% | 39.5% | 39.5% | 39% |

TABLE 5-continued

Reading* of the screen corresponding to 40% of the Ugra scale at different UV exposure times

| Plates | 30 seconds | 40 seconds | 50 seconds | 60 seconds |
|---|---|---|---|---|
| C | image completely wiped off | image completely wiped off | image completely wiped off | image completely wiped off |

*The reading was carried out using a Viplate 110 densitometer from the company Viptronic.

TABLE 6

Scale of greys at different UV exposure times

| Plates | 30 seconds | 40 seconds | 50 seconds | 60 seconds |
|---|---|---|---|---|
| A | 3 veiled 7 full | 3/4 veiled 8 full | 4 veiled 8 full | 4/5 veiled 9 full |
| B | 2 veiled 7 full | 3 veiled 7/8 full | ¾ veiled 8 full | 4 veiled 9 full |
| C | 3 veiled 11 full | 4 veiled 11/12 full | 4/5 veiled 13 full | 5 veiled 13 full |

TABLE 7

Positive microlines at different UV exposure times

| Plates | 30 seconds | 40 seconds | 50 seconds | 60 seconds |
|---|---|---|---|---|
| A | 6 visible | 6/8 visible | 10 visible | 10/12 visible |
| B | 6 visible | 6 visible | 6/8 visible | 8 visible |
| C | 6/8 visible | 6/8 visible | 12/15 visible | 12/15 visible |

TABLE 8

Reproduction of the minima at different UV exposure times

| Plates | 30 seconds | 40 seconds | 50 seconds | 60 seconds |
|---|---|---|---|---|
| A | 2% clearly visible 1% partially visible | 2% clearly visible | 3% clearly visible 2% visible | 3% clearly visible 2% visible |
| B | 2% clearly visible 1% partially visible | 2% clearly visible | 3% clearly visible 2% visible | 3% clearly visible 2% visible |
| C | 2% clearly visible 1% partially visible | 3% clearly visible 2% partially visible | 4% clearly visible 3% partially visible | 4% clearly visible 3% partially visible |

TABLE 9

Reproduction of the maxima at different UV exposure times

| Plates | 30 seconds | 40 seconds | 50 seconds | 60 seconds |
|---|---|---|---|---|
| A | 98% open | 98% open | 99% open | 99% open |
| B | 98% open | 99% open | 99% open | 99% open |
| C | 98% open | 99% open | 99% open | 99% open |

TABLE 10

Reading* of the screen corresponding to 40% of the Ugra scale at different UV exposure times

| Plates | 30 seconds | 40 seconds | 50 seconds | 60 seconds |
|---|---|---|---|---|
| A | 40.5% | 40% | 39% | 39% |
| B | 40.5% | 40.5% | 40% | 39.5% |
| C | 41.5% | 37.5% | 36% | 35% |

*The reading was carried out using a Viplate 110 densitometer from the company Viptronic.

The results given in Tables 1–5 above show that, when the developing time (50 seconds) is that of ordinary developers used in lithographic laboratories, the photosensitive composition on the plates C is completely wiped off, whereas the composition on the plates of the invention is not wiped off. In other words, the image is also wiped off the plates C.

On the other hand, the image is not wiped off the plates C only when the developing time (10 seconds) is very much shorter than that at which ordinary developers used in lithographic laboratories work (Tables 6–10). It follows that plates C are usable only if processed with a post-heating step after IR or UV exposure. Plate C is, therefore, useful for obtaining a negative image only.

Test 1

Resistance to Isopropyl Alcohol

Six first plates (weight of coating: 1.4 g/m$^2$; Plate A) and 6 second plates (weight of coating: 1.8 g/m$^2$; Plate B), prepared as described in Example 1, were used in comparison with 6 Kodak plates sold under the name Direct Image Thermal Printing Plate (Plate C) which were assumed to have been produced according to patent application EP 0 672 954.

A 2×30 cm strip was removed from each plate. The 18 strips were immersed, in successive "steps" of 4 cm/minute, in a graduated cylinder containing an aqueous 40% isopropyl alcohol solution.

A scale composed of 6 zones, with immersion times of 1 minute for the first "step" of the scale, up to 6 minutes for the last step, was thus obtained. After immersion, an adhesive tape was placed on the surface of each strip, and this tape was then immediately removed in order to evaluate the degree of deterioration of the photosensitive layer caused by the isopropyl alcohol solution. More particularly, the amount of photosensitive layer taken off by the adhesive tape because it had been "degraded" by the prior immersion in isopropyl alcohol was evaluated.

The results are illustrated in Table 11 below.

TABLE 11

| Plate | 1 | 2 | 3 | 4 | 5 | 6 |
|---|---|---|---|---|---|---|
| A | | | X | | | |
| B | | | | | X | |
| C | X | | | | | |

The value 1 indicates the worst score, i.e. when 50% of the photosensitive layer comes off after immersion for 1 minute, whereas a score of 6 indicates the best score, i.e. when 50% of the photosensitive layer comes off after immersion for 6 minutes.

The data given in Table 11 demonstrate that the composition of the present invention has sufficient resistance to isopropyl alcohol, whereas Plate C has entirely insufficient resistance. It follows that plates C is usable only if processed with a post-heating step after IR or UV exposure. Plate C is, therefore, useful for obtaining a negative image only.

Test 2

Resistance to Mechanical Abrasion

In order to simulate the mechanical and chemical abrasion to which a plate is subjected during the printing stage, samples of exposed and developed plates of type A, B and C (Test 1) were fixed to a surface and placed in close contact with a pad of cotton wool soaked in 50% isopropyl alcohol solution. The pad was alternatively moved by an arm connected to a compressed-air system to simulate the chemical-mechanical stress undergone by the plates during printing. Tests with different numbers of wiping actions (50, 100, 150 and 200) were carried out.

Table 12 shows the number of wiping actions which remove 50% by weight of emulsion.

TABLE 12

| Plate | 50 | 100 | 150 | 200 |
|---|---|---|---|---|
| A |  | X |  |  |
| B |  |  |  | X |
| C | X |  |  |  |

After 50 wiping actions, the composition of plate C was almost completely wiped off, while the compositions of plates A and B showed a very good resistance.

EXAMPLE 11

IR exposure Followed by UV Exposure

The Ugra/Fogra PostScript Control Strip digital scale was projected onto a plate having the compositions of the above Examples 1,2,4,7 and 8 by means of a software-controlled laser beam ($\lambda$=830 nm; power of 150 and 300 mJ/cm$^2$). Before development, plates previously exposed to IR, were completely irradiated with UV radiation at different exposure times (5, 10, 20 and 40 seconds).

It was used a model EM 87 Lastra apparatus with a 5000 W actinic-light lamp placed 1.20 m from the plate support plane.

Plates were then subjected to two developing tests:
1) An alkaline metasilicate solution at 20° C. (Lsp 75 positive developing solution from Lastra S.p.A. having a conductivity of about 80 mS) was used. The developing step was carried out by immersing the plate in an alkaline solution for 50 seconds followed by a superficial cleaning with cotton for 10 seconds. All the plates under evaluation completely lost the coating which passed into the developing solution.
2) An alkaline metasilicate solution at 20° C. (Lsp 75 positive developing solution from Lastra S.p.A., 1: 1 diluted with deionized water having a conductivity of about 50 mS) was used. The developing step was carried out by immersing the plate in an alkaline solution for 50 seconds followed by a superficial cleaning with cotton for 10 seconds. All the plates under evaluation completely lost the coating which passed into the developing solution.

EXAMPLE 12

IR Exposure and Oven-heating

The Ugra/Fogra PostScript Control Strip digital scale was projected onto a plate, having the compositions of the above Examples 1,2,4,7 and 8, by means of a software-controlled laser beam ($\lambda$=830 nm; power of 150 and 300 mJ/cm$^2$). Before development, the plates previously exposed to IR, underwent an oven-heating treatment in a model M80-VF Pid System apparatus from Instrument S.r.I. company (Bernareggio, Milan, Italy) at two different temperatures (125 and 135° C.), each for three different times (60, 120 and 180 seconds). Then, the plates were developed with an alkaline metasilicate solution at 20° C. (Lsp 75 positive developing solution from Lastra S.p.A. having a conductivity of about 80 mS). The developing step was carried out by immersing the plate in an alkaline solution for 50 seconds followed by a superficial cleaning with cotton for 10 seconds.

All the plates showed a decrease of the coating solubilization rate in the developer. The solubilization rate decreased as the treatment temperature increased. The solubilization rate also decreased as the treatment time increased. However, the image which remained on the plate always corresponded to the positive of the image exposed to IR radiation.

What is claimed is:

1. A photosensitive composition comprising
   (a) a diazo resin,
   (b) a diazo ester which is a product of partial or total esterification of a tetrahydroxybenzophenone with a 2,1-naphthoquinonediazidesulphonyl chloride,
   (c) at least a novolac resin,
   (d) a IR absorber, and
   wherein said composition has a property of forming a positive image when exposed to only IR or only UV radiations, wherein it comprises two novolac resins.

2. Composition according to claim 1, wherein the first novolac resin has a weight-average molecular weight of from 2000 to 6000.

3. Composition according to claim 1, wherein the second novolac resin has a weight-average molecular weight of from 7000 to 14,000.

4. Composition according to claim 1, wherein the first novolac resin has a weight-average molecular weight of from 3000 to 5000.

5. Composition according to claim 1, wherein the second novolac resin has a weight-average molecular weight of from 8000 to 10,000.

6. A lithographic plate comprising a support coated with a photosensitive composition wherein
   (1) the said composition comprises
      (a) a diazo resin
      (b) a diazo ester which is a product of partial or total esterification of a tetrahydroxybenzophenone with a 2,1-naphthoquinonediazide sulphonyl chloride,
      (c) at least a novolac resin,
      (d) an IR absorber, and
   (2) the said composition has a property of forming a positive image when exposed to only IR or only UV radiations, wherein it comprises two novolac resins.

7. Plate according to claim 6, wherein the first novolac resin has a weight-average molecular weight of from 2000 to 6000.

8. Plate according to claim 6, wherein the second novolac resin has a weight-average molecular weight of from 7000 to 14,000.

9. Plate according to claim 6, wherein the first novolac resin has a weight-average molecular weight of from 3000 to 5000.

10. Plate according to claim 8, wherein the second novolac resin has a weight-average molecular weight of from 8000 to 10,000.

11. A photosensitive composition comprising
(a) a diazo resin,
(b) a diazo ester,
(c) at least one novolac resin,
(d) at IR ray absorber, and
is sensitive to both IR radiation and UV radiation;
wherein the diazo resin is the product of esterification of 2,1-naphthoquinonediazide-4-sulphonyl chloride with a polycondensation product of phenol or homologues thereof;
wherein the phenol homologue is m-cresol or symmetric xylenol;
wherein the diazo ester is a product of partial or total esterification of a tetrahydroxybenzophenone with a 2,1-naphthoquinonediazidesulphonyl chloride;
wherein the tetrahydroxybenzophenone is 2,3,4,4'-tetrahydroxybenzophenone or 2,2,',4,4'-tetrahydroxybenzophenone;
wherein the 2,1-naphthoquinonediazidesulphonyl chloride is 2,1-naphthoquinonediazide-4-sulphonyl chloride or 2,1-naphthoquinonediazide-5-sulphonyl chloride; and
wherein the composition comprises two novolac resins.

12. Composition according to claim 11, wherein the first novolac resin has a weight-average molecular weight of from 2000 to 6000.

13. Composition according to claim 11, wherein the second novolac resin has a weight-average molecular weight of from 7000 to 14,000.

14. Composition according to claim 11, wherein the first novolac resin has a weight-average molecular weight of from 3000 to 5000.

15. Composition according to claim 11, wherein the second novolac resin has a weight-average molecular weight of from 8000 to 10,000.

16. A lithographic plate comprising a support coated with a photosensitive composition, wherein
(1) the said composition comprises
(a) a diazo resin,
(b) a diazo ester,
(c) at least one novolac resin,
(d) an IR ray absorber, and in that
(2) the said composition is sensitive to both IR radiation and UV radiation;
wherein the diazo resin is the product of esterification of a 2,1-naphthoquinonediazide-4-sulphonyl chloride with a polycondensation product of phenol or homologues thereof;
wherein the phenol homologue is m-cresol or symmetric xylenol;
wherein the diazo ester is a product of partial or total esterification of a tetrahydroxybenzophenone with a 2,1-naphthoquinonediazidesulphonyl chloride;
wherein tetrahydroxy benzophenone is 2,3,4,4'-tetrahydroxybenzophenone or 2,2',4,4'-tetrahydroxybenzophenone;
wherein the 2,1-naphthoquinonediazidesulphonyl chloride is 2,1-naphthoquinonediazide-4-sulphonyl chloride or 2,1-naphthoquinonediazide-5-sulphonyl chloride; and
wherein the composition comprises two novolac resins.

17. Plate according to claim 16, wherein the first novolac resin has a weight-average molecular weight of from 2000 to 6000.

18. Plate according to claim 16, wherein the second novolac resin has a weight-average molecular weight of from 7000 to 14,000.

19. Plate according to claim 16, wherein the first novolac resin has a weight-average molecular weight of from 3000 to 5000.

20. Plate according to claim 18, wherein the second novolac resin has a weight-average molecular weight of from 8000 to 10,000.

21. Composition according to claim 5, wherein the second novolac resin is substantially monomers-free.

22. Plate according to claim 10, wherein the second novolac resin is substantially monomers-free.

23. Composition according to claim 15, wherein the second novolac resin is substantially monomers-free.

24. Plate according to claim 20, wherein the second novolac resin is substantially monomers-free.

* * * * *